US005349217A

United States Patent [19]

Boysel

[11] Patent Number: 5,349,217

[45] Date of Patent: Sep. 20, 1994

[54] VACUUM MICROELECTRONICS DEVICE

[75] Inventor: R. Mark Boysel, Plano, Tex.

[73] Assignee: Texas Instruments Incorporated, Dallas, Tex.

[21] Appl. No.: 144,159

[22] Filed: Oct. 27, 1993

Related U.S. Application Data

[63] Continuation of Ser. No. 739,268, Aug. 1, 1991, abandoned.

[51] Int. Cl.[5] .................... H01L 23/48; H01L 29/44; H01J 1/46; B23P 15/00

[52] U.S. Cl. .................................... 257/266; 257/99; 257/101; 257/102; 257/264; 313/308; 313/309; 313/336; 313/351; 156/644; 156/653; 156/656; 156/657; 156/659.1

[58] Field of Search ................ 257/96, 101, 102, 191, 257/656, 183.1, 26, 273, 289, 266, 264; 156/644, 653, 656, 657, 659; 313/308, 309, 336, 351

[56] References Cited

U.S. PATENT DOCUMENTS

| | | | |
|---|---|---|---|
| 4,943,343 | 7/1990 | Bardai et al. | 156/643 |
| 4,983,878 | 1/1991 | Lee et al. . | |
| 5,012,153 | 4/1991 | Athinson et al. | 313/336 |
| 5,077,597 | 12/1991 | Mishra | 257/96 |
| 5,127,990 | 7/1992 | Pribat et al. | 156/644 |
| 5,136,205 | 8/1992 | Sokolich et al. | 313/309 |

FOREIGN PATENT DOCUMENTS

| | | |
|---|---|---|
| 0306173 | 3/1989 | European Pat. Off. . |
| 0350378 | 1/1990 | European Pat. Off. . |

OTHER PUBLICATIONS

"Physical Considerations in Vacuum Microelectronics" by Ivor Brodie, *IEEE Transactions on Electron Devices*, vol. 36, No. 11, Nov. 1989.

"Physical Properties of Thin-Film Field Emission Cathodes with Molybdenum Cones" by C. A. Spindt, I. Brodie, L. Humphrey & E. R. Westerberg, *Journal of Applied Physics* vol. 47, No. 12 Dec. 1976.

"Modeling and Fabricating Micro-Cavity Integrated Vacuum Tubes" by William J. Orvis, Charles McConaghy, Dino R. Ciarlo, Jack Yee & Ed Hee, *IEEE Transactions on Electrons Devices* vol. 36, No. 11 Nov., 1989.

*Primary Examiner*—Sara W. Crane
*Assistant Examiner*—Carl Whitehead, Jr.
*Attorney, Agent, or Firm*—Charles A. Brill; James C. Kesterson; Richard L. Donaldson

[57] ABSTRACT

A method for producing a vacuum microelectronics device ( 10 ) on a substrate ( 12 ) and insulating dielectric (14) first forms an electrode base (16) on the insulating dielectric (14). Next, electrode base (16) is covered with a first organic spacer (42) having an aperture (44) for exposing a portion of electrode base (16). Next, a metal layer (46) is applied over organic spacer (42) to form emitter (18) within aperture (44). After removal of organic spacer (42) and metal layer (46), a second organic spacer (44) and a grid material (20) are applied over emitter (18) and electrode base (16). Next, a third organic spacer (50) and an anode metal (22) with access apertures ( 34 ) and ( 36 ) are placed over the structure. After removing organic spacers (48) and (50), anode metal (22) is sealed with metal (26) to close off access apertures ( 34 ) and ( 36 ). The result is a vacuum microelectronics device (10) usable is a triode or diode.

6 Claims, 1 Drawing Sheet

VACUUM MICROELECTRONICS DEVICE

This application is a continuation of application Ser. No. 07/739,268, filed 8/01/91, now abandoned.

TECHNICAL FIELD OF THE INVENTION

The present invention relates in general to microelectronics devices and methods for producing the same, and more particularly to a method for building a vacuum microelectronics triode or diode using an organic spacer material.

BACKGROUND OF THE INVENTION

With the advent of semiconductor technology, microwave transistor manufacturers and other electronic system designers compromised some degree of power and high speed for the overriding economic and technological advantages of semiconductor technology. Two principal advantages of semiconductor technology are the small size and the ability to manufacture thousands of separate identical devices with few manufacturing process steps. With increasing power demands for electronic systems and the requirement that the systems operate at even higher frequencies, however, electronic component designers are reconsidering the construction of semiconductor devices. In particular, some designers are considering the possibility of incorporating the advantages of vacuum tube technology at microelectronics scale of semiconductor devices.

Attempts have been made to create an enclosed chamber having an emitter, a grid, and an anode constructed on a single silicon substrate using semiconductor process technology. The obvious advantages of this approach are cost effectiveness and use of the semiconductor process techniques and high volume output inherent in these methods. To date, however, these attempts have been unsuccessful. One noteworthy effort has been to establish within a silicon substrate an oxide base on which a high temperature metal is placed and an electrode is formed. For example, C.A. Spindt, et al., "Physical Properties of Thin-Film Field Emission Cathodes with Molybdenum Cones," J. App Physics, Vol. 47, No. 12 (Dec. 1976) describes a semiconductor process for producing a thin-film field emission cathode using semiconductor technology. Other more recent attempts have been successful in establishing a grid that may be used for a microelectronics triode or diode. However, as yet there have been no successful attempts to establish a vacuum microelectronics chamber comprising an emitter, a grid, and an anode for use as a vacuum microelectronics triode or diode. In particular, there have been no successful attempts to seal a vacuum within a microelectronics device of this type using solely semiconductor device fabrication techniques.

Those attempts which have successfully produced a cathode or emitter and even a grid use the oxide and high temperature metal combination already described. In fabricating the emitter and grid structures in these processes, it is necessary to remove the oxide. The oxide, however, can not be isotropically plasma-etched in a semiconductor fabrication process. It must be wet-etched in a heated wet-etch process. Significant problems associate with the removal of the oxide with a wet-etch process. For example, wet-etch material residue invariably will remain on the emitter and grid. Moreover, wet-etch processes that remove the oxide also remove the metal, even for high temperature refractory metals. Using the oxide and high temperature metal techniques, it has not yet been shown that a vacuum seal can be achieved.

Consequently, there is the need for a method for producing a vacuum microelectronics device such as a triode or diode that while incorporating the advantages of semiconductor process technology provides the improved power and speed advantages of vacuum tube technology.

There is the need for a method for producing a microelectronics device that successfully creates a vacuum seal chamber on a semiconductor substrate.

There is the further need for a method for producing a vacuum microelectronics device that avoids the residue problems and metal etch problems associated with known methods for producing an emitter and grid on a semiconductor substrate.

Furthermore, there is the need for a method for producing a vacuum microelectronics device that in a simple process produces multitudes of vacuum chambers comprising an emitter, a grid and an anode to form microelectronics triodes or diodes on a semiconductor substrate.

SUMMARY OF THE INVENTION

Accordingly, there is provided a method for producing a vacuum microelectronics device that overcomes the limitations and satisfies the needs previously identified. According to one aspect of the invention, there is provided a method for producing a vacuum microelectronics device on a substrate material that comprises the steps of first forming an insulating dielectric on the substrate.

On the insulating dielectric is formed an electrode base which is then covered with a first organic spacer. This first organic spacer has a cylindrical aperture for exposing a portion of the electrode. The next step is to apply a metal over the first organic spacer so that the metal enters the aperture to form an emitter point in contact with the electrode base. The next step is to remove the metal from the first organic spacer and then form a second spacer on the emitter and electrode base. On the second organic spacer is applied a grid metal that exposes a portion of the second organic spacer over the emitter and based. Then, a third organic spacer is placed over the grid metal and the exposed portion of the second organic spacer. Next, the method requires applying an anode metal cover over the third organic spacer.

The anode material comprises a plurality of access apertures that expose the third organic spacer. The next step is to evacuate the third and second organic spacers that are beneath the anode material cover and the grid metal in a plasma etch process by which the plasma enters the apertures of the anode metal cover, etches away the third organic spacer and the second organic spacer to create a space between the emitter and electrode base and a space between the grid and the anode metal cover. Thereafter, a metal seal is placed over the anode metal cover that closes off the apertures in the anode metal cover to maintain a vacuum beneath the metal seal when the vacuum microelectronics device leaves the vacuum of the process chamber.

A technical advantage of the present invention is that it provides a simple and effective method for producing a vacuum microelectronics device usable as a triode or diode.

Another technical advantage of the present invention is that it uses existing semiconductor process technology to produce a heretofore unavailable microelectronics device having the potential to restore to electronic component designers the power and speed advantages of vacuum tube technology within a small device capable of mass production.

Yet another technical advantage of the present invention is that not only is it a novel way to produce the vacuum microelectronics device, but it also avoids the problems associated with wet etching an oxide material and the necessary use of high temperature refractory metals.

BRIEF DESCRIPTION OF THE DRAWINGS

The invention, as well as modes of use and further advantages, is best understood by reference to the following description of a luster to the embodiments when read in conjunction with the accompanying drawings, wherein.

DETAILED DESCRIPTION OF THE INVENTION

The preferred embodiment of the present invention is best understood by referring to FIGS. 1–5 of the drawings, like numerals being used for like and corresponding parts of the various drawings.

Figure 1:
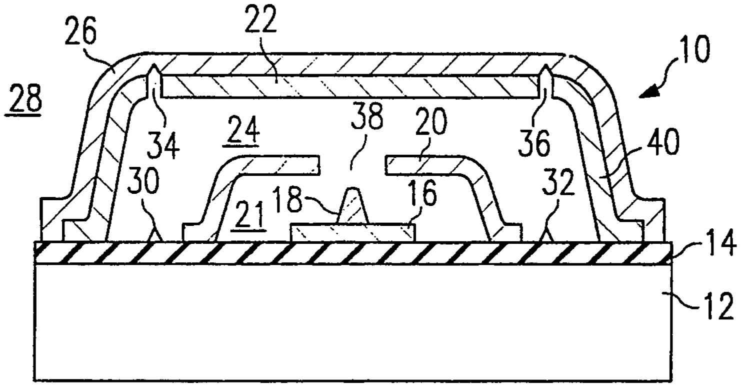
FIG. 1 is a side schematic drawing of a preferred embodiment of the present invention.

FIG. 1 shows the side schematic view of the preferred embodiment of the present invention. The vacuum microelectronics device 10 may be used as a vacuum triode or diode and may be manufactured with known semiconductor device fabrication technologies on a semiconductor substrate. Referring in particular to the preferred embodiment of microelectronics device 10 in FIG. 1, on substrate material 12 appears insulating dielectric 14. Insulating dielectric 14 supports base electrode 16 to which attaches emitter 18. Electrode base 16 and emitter 18 are separated from grid 20 by space 21. Grid 20 is separated from anode material 22 by space 24. Covering anode metal 22 is metal seal 26 which establishes a vacuum within chambers 24 and 21 relative to the ambient pressure at 28. Anode metal 22 and metal seal 26, as well as grid 20 attach to insulating dielectric 14. Within space 24 appear two small deposits 30 and 32 of metal from metal seal 26 that have fallen through apertures 34 and 36 of anode layer 22. It should also be noted that aperture 38 of grid material 20 connects space 21 to space 24 to establish the complete vacuum chamber 40.

Figure 2:
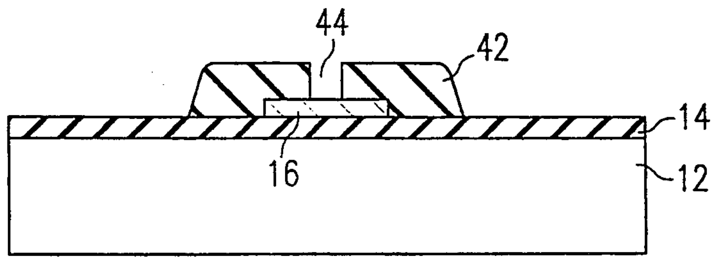
FIGS. 2–5 illustrate progressive stages in the formation of the preferred embodiment.

FIGS. 2–5 illustrate the method of forming the vacuum microelectronics device according to the preferred embodiment. Referring to FIG. 2, on substrate 12 and insulating dielectric 14 is sputtered electrode base 16 and a pattern of photoresist 42 to operate as an organic spacer. Photoresist 42 includes aperture 44 having a width or diameter roughly equivalent to the height of photoresist layer 42 above electrode base 16.

Figure 3:
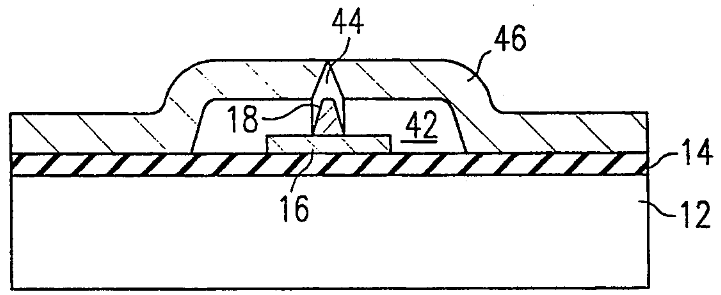

FIG. 3 illustrates the next step in the method of the preferred embodiment. Over photoresist 42 and insulating dielectric 14 is placed a layer of emitter metal 46 having a depth approximately equal to the width of aperture 44. Over aperture 44, emitter metal 46 will deposit through aperture 44 in photoresist 42 and on electrode base 16. As emitter metal layer 46 thickens, the amount of metal that drops into aperture 44 decreases in a conical form to yield the emitter 18 having a height approximately equal to the distance between the top of photoresist 42 and the point at which photoresist 42 contacts electrode base 16. Then, the method of the preferred embodiment requires removal of both emitter metal 46 and photoresist 42 using a standard lift off technique.

Figure 4:
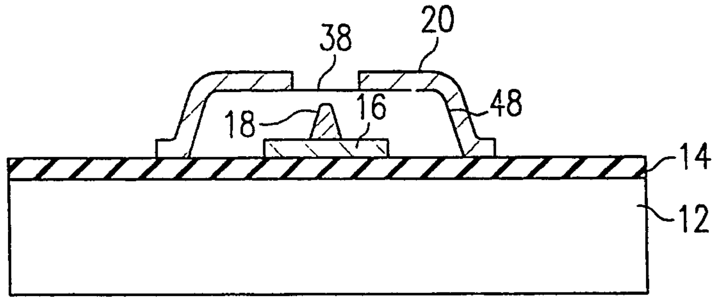
Figure 5:
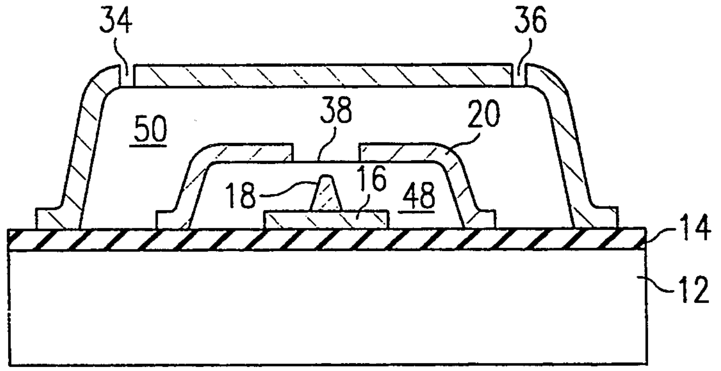

FIG. 4 illustrates the next step in manufacturing the vacuum microelectronics device of the preferred embodiment. First, a layer of photoresist 48 is deposited over emitter 18 and electrode base 16 on insulating dielectric 14. Next, grid metal 20 is patterned over photoresist 48 in contact with insulating dielectric 14 and having aperture 38 over emitter 18 and electrode base 16. The next step, as FIG. 5 illustrates, is to form over grid metal 20, and photoresist 48 and aperture 38 a third layer of photoresist 50 to serve as an organic spacer upon which may be patterned anode metal 22. Anode metal 22 is then formed over photoresist layer 50. Anode metal 22 includes small apertures 34 and 36.

At this point, a plasma etch process takes place to introduce plasma through apertures 34 and 36 to remove third photoresist layer 50 and the second photoresist layer 48. Because of aperture 38, once the plasma etches away photoresist layer 50 it passes through aperture 38 to remove photoresist layer 48.

Once all of the photoresist is removed with the plasma etch process, the method requires sealing off the space remaining. Returning to FIG. 1, there is illustrated the result of this sealing step. According to FIG. 1, metal seal 26 forms over anode metal 22 to seal apertures 34 and 36 and maintain a vacuum within space 24 defined by anode metal 22, and within grid metal 20. Metal seal 26 has sufficient thickness to overcome the effect of dropping metal through apertures 34 and 36 to close off and actually seal off anode metal 22. Note that from apertures 34 and 36 respectively small deposits 30 and 32 of metal seal 26 fall to insulating dielectric 14. Provided that these deposits do not contact either anode metal 22 or grid metal 20, no interference with the operation of microelectronics device 10 should result. It should be noted that, as with semiconductor fabrication processes in general, the above steps are performed in a vacuum environment. The vacuum of the process environment is maintained within spaces 24 and 21 of the preferred embodiment as microelectronics device 10 leaves the process environment. This is a result of the vacuum tight seal of metal seal 26.

Using the method of the preferred embodiment, spaces 24 and 21 are much cleaner and have less residue than when an oxide material is used that must be removed by a wet-etch process. Moreover, because the organic spacer is used, there is not a need to use the high temperature refractory metals consistent with the oxide removal techniques. A variety of metals may be used that do not react with the plasma that etches away the organic spacers 48 and 50. This makes the manufacturing process for vacuum microelectronics device 10 much simpler than when using oxide-spacer techniques. Additionally, taking advantage of the sealing effect when laying metal seal 26 over anode metal 22. As a result, the process of the preferred embodiment permits production of vacuum microelectronics device using available semiconductor device fabrication techniques.

Using the method of the preferred embodiment, it is possible to create a vacuum seal without having to mechanically overlay a sealing metal or a sealing material. This is the only heretofore used method of sealing off a grid and emitter structure to create a microelectronics triode or diode. The present invention, to the contrary, takes place totally according to a semiconductor device manufacturing process and does not require the external or mechanical overlay of a sealing metal. This eliminates any type of alignment or other error that may exist with the external or mechanical joining of the sealing material.

Substrate 12 may be any type of silicon material typically used for semiconductor device fabrication such as silicon dioxide. Insulating dielectric 14 may be any type of insulating dielectric consistent with the purposes of the present invention. Electrode base of the preferred embodiment is tungsten, because of its strength and ability to withstand high electrical potentials associated with emitter 18. However, all the refractory metals such as molybdenum or nickel sufficient to provide the necessary strength and ability to withstand electrical potentials may be used. For photoresist or organic spacers 42, 48 and 50, material susceptible to plasma etching and known in deformable mirrored device technology are usable with the present invention. The photoresist is a plastic type material susceptible to plasma etching the semiconductor device processes.

Instead of the configuration of FIG. 3, it may be desirable to form a continuous layer of photoresist 42 having aperture 44 across the entire surface of insulating dielectric 14 and instead of the raised structure of metal layer 46, lay a continuous layer of metal over the continuous layer of photoresist to still form emitter 18, but permit in one lift off removal step, the removal both the photoresist layer 42 and metal layer 46 to leave on insulating dielectric 14 electrode base 16 and emitter 18. Thereafter, photoresist 48 may be placed over emitter 18 and electrode base 16 as FIG. 4 shows.

Instead of providing access holes 34 and 36, it may be possible to form anode metal 22 so that a portion of anode metal 22 some distance away from grid metal 20 does not cover photoresist 50. In such configuration, however, it would be necessary to assure sufficient structural support to maintain anode material 22 in the same shape following removal of photoresist 50. In any event, if anode material 22 were to form so that apertures 34 and 36 did not exist, but that still an opening to photoresist 50 exists, the plasma etching process to subsequently remove photoresist 50 and photoresist 48 could occur. Thereafter, of course, metal seal 26 could be used to fully seal anode metal 22.

In the preferred embodiment of vacuum microelectronics device 10, dimensions for the various layers are the following: Electrode base 16, grid metal 20, anode metal 22 and metal seal 26 all should have a thickness of approximately one micron. Emitter 18 has a height of approximately one micron and aperture 38 a width of between one to two microns. The height from insulating dielectric 14 to the interior side of ground electrode 20 should be between two and three microns while the height from insulating dielectric 14 to the interior side of anode metal 22 should be approximately four to five microns. Access apertures 34 and 36 should have a diameter as small as possible and approximately 0.5 microns.

The structural properties of the various materials for vacuum microelectronics device 10 should also be considered as well as the electrical properties of emitter 18, grid 20 and anode 22. Moreover, the needs for connecting leads to each of these elements may also determine the size of each of the elements within vacuum microelectronics device 10.

Although the invention has been described with reference to the above specific embodiment, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A microelectronics device on a semiconductor substrate, comprising:

a semiconductor substrate;

an insulating layer on said substrate;

an electrode base on said insulating layer;

an emitter point on said electrode base;

a grid metal separated from said emitter point and said electrode base; and an anode metal on said insulating layer, said anode metal separated from said grid metal, emitter point and electrode base, said anode metal and said insulating layer forming a chamber enclosing said emitter point and having apertures allowing access to said chamber.

2. The apparatus of claim 1, wherein said electrode base comprises a tungsten material.

3. The apparatus of claim 1, wherein said grid metal associates within said microelectronics device to form a triode.

4. The apparatus of claim 1, wherein said grid metal associates within said microelectronics device to form a diode.

5. The apparatus of claim 1, further comprising a metal seal deposited on said anode metal and closing said apertures wherein said anode metal and said seal maintain a vacuum in said chamber.

6. The apparatus of claim 1, wherein said emitter point, grid metal, and anode metal are formed by the steps of applying and removing a plurality of layers of organic spacer material.

* * * * *